US010861668B2

(12) United States Patent
Pan et al.

(10) Patent No.: US 10,861,668 B2
(45) Date of Patent: *Dec. 8, 2020

(54) PLASMON-EXCITED ELECTRON BEAM ARRAY FOR COMPLEMENTARY PATTERNING

(71) Applicant: Purdue Research Foundation, West Lafayette, IN (US)

(72) Inventors: Liang Pan, West Lafayette, IN (US); Xianfan Xu, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/128,441

(22) Filed: Sep. 11, 2018

(65) Prior Publication Data

US 2019/0019648 A1 Jan. 17, 2019

Related U.S. Application Data

(63) Continuation of application No. 15/176,147, filed on Jun. 7, 2016, now Pat. No. 10,074,509.

(60) Provisional application No. 62/172,097, filed on Jun. 7, 2015.

(51) Int. Cl.
| | |
|---|---|
| *H01J 37/10* | (2006.01) |
| *H01J 37/06* | (2006.01) |
| *H01J 37/12* | (2006.01) |
| *H01J 37/317* | (2006.01) |
| *G02B 5/00* | (2006.01) |
| *H01J 37/073* | (2006.01) |

(52) U.S. Cl.
CPC .............. *H01J 37/10* (2013.01); *G02B 5/008* (2013.01); *H01J 37/06* (2013.01); *H01J 37/073* (2013.01); *H01J 37/12* (2013.01); *H01J 37/3174* (2013.01); *H01J 37/3177* (2013.01); *H01J 2201/342* (2013.01); *H01J 2237/0492* (2013.01); *H01J 2237/062* (2013.01); *H01J 2237/06333* (2013.01); *H01J 2237/202* (2013.01); *H01J 2237/20221* (2013.01)

(58) Field of Classification Search
CPC .. H01J 37/10; H01J 37/06; H01J 37/12; H01J 37/3174; H01J 2237/0492; H01J 2237/202; H01J 2237/20221
USPC ....................... 250/423 R, 424, 423 F, 423 P
See application file for complete search history.

(56) References Cited

U.S. PATENT DOCUMENTS 10,074,509 B2 * 9/2018 Pan .......................... H01J 37/06

* cited by examiner

*Primary Examiner* — Nicole M Ippolito
(74) *Attorney, Agent, or Firm* — Purdue Research Foundation

(57) ABSTRACT

A system for generating an electron beam array, comprising a light source, a first substrate having a plurality of plasmonic lenses mounted thereon, the plasmonic lenses configured to received light from the light source and produce an electron emission, and a plurality of electrostatic microlenses configured to focus the electron emissions into a beam for focusing on a wafer substrate. A light source modulator and digital micro mirror may be included which captures light from the light source and projects light beamlets on the plasmonic lenses.

20 Claims, 14 Drawing Sheets

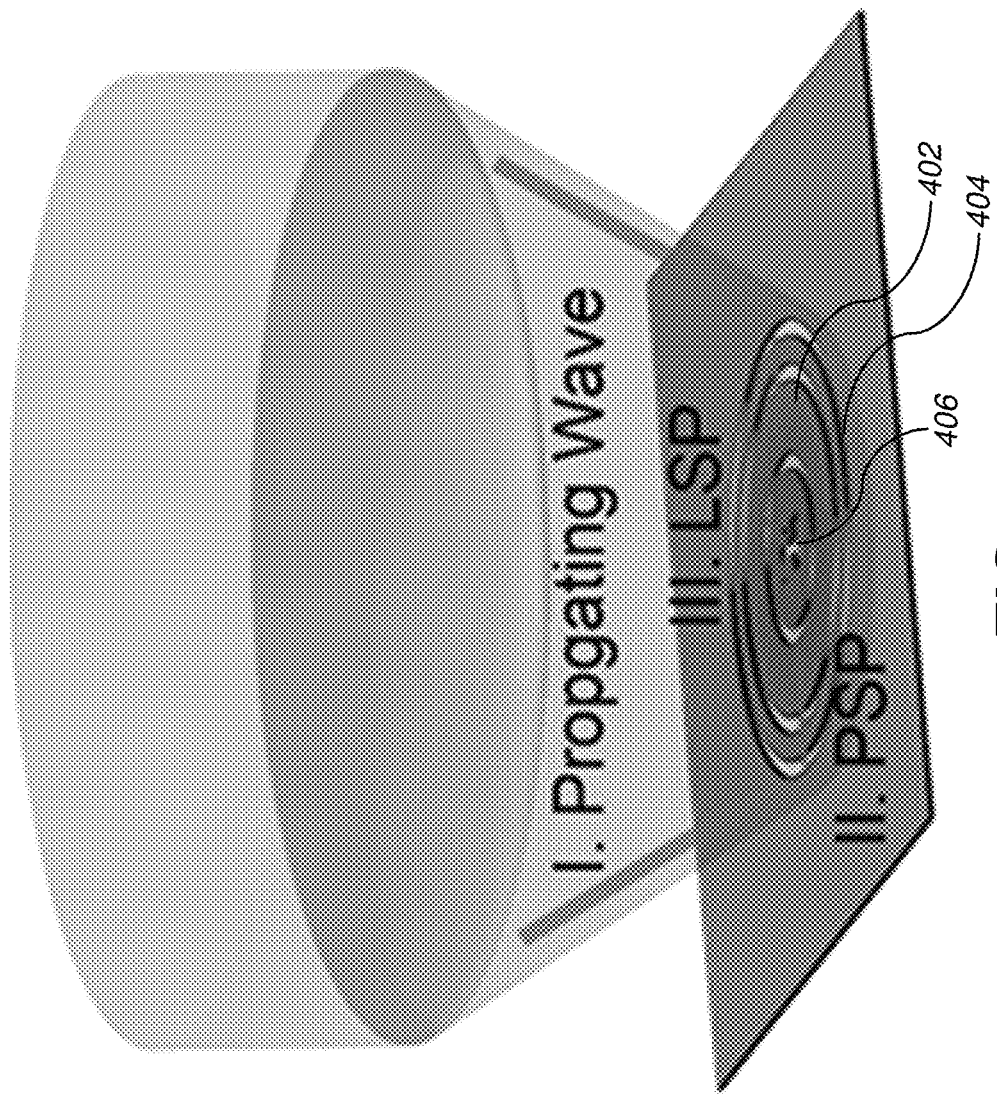

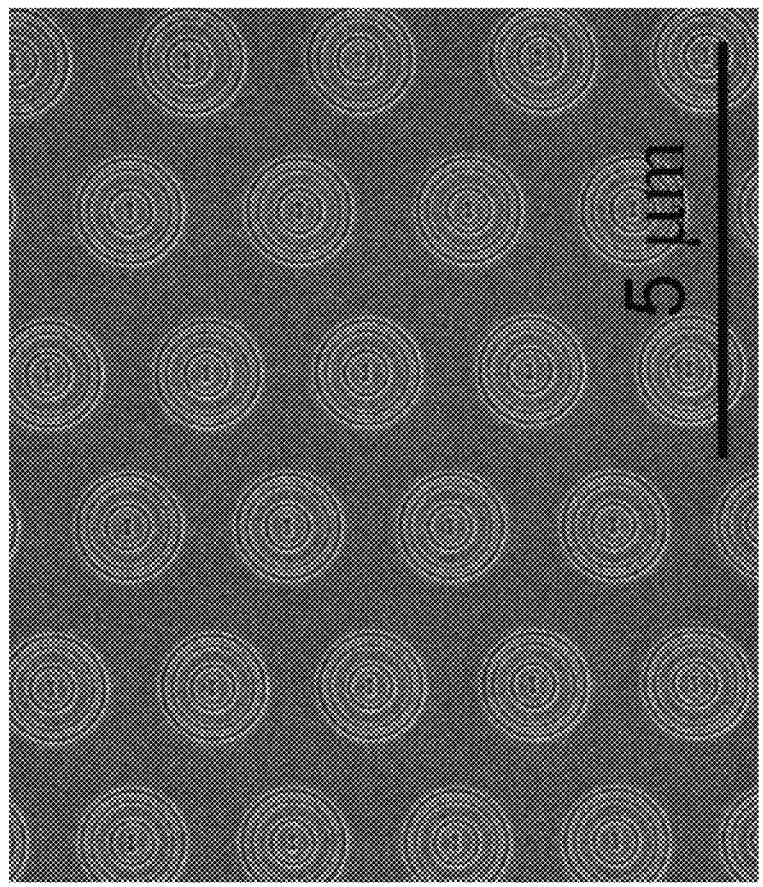

PLASMON-EXCITED ELECTRON BEAM ARRAY FOR COMPLEMENTARY PATTERNING

CROSS-REFERENCE TO RELATED APPLICATIONS

The present patent application is a continuation of U.S. Utility application Ser. No. 15/176,147, filed Jun. 7, 2016, which is related to and claims the priority benefit of U.S. Provisional Patent Application Ser. No. 62/172,097, filed Jun. 7, 2015, the contents of which is hereby incorporated by reference in its entirety into this disclosure.

STATEMENT REGARDING GOVERNMENT FUNDING

This invention was made with government support under CMMI1405078 awarded by the National Science Foundation. The government has certain rights in the invention.

TECHNICAL FIELD

The present application relates to nanomanufacturing systems, and more specifically, to maskless nanomanufacturing systems.

BACKGROUND

Developments of nanotechnology call for scalable top-down nanomanufacturing methods to carry on the trends of ever-decreasing critical dimensions and ever-increasing design complexities. Optical lithography, the process of transferring geometric shapes on a mask to a wafer, has been the critical enabling step for determining nanotechnology device performances such as the transistor density and speed in microprocessors. Driven by the fundamental light diffraction and Moore's law, optical lithography researchers have been continuously scaling down the working wavelength in order to produce finer features, leading to dramatically increasing process costs. Current deep-UV tools cost $50M each, and the costs for masks far outweigh those for tools. The cost of next generation extreme-UV tools is expected to exceed $200M each. The future tools will soon become too costly for both industrial productions and scientific researches. Optical lithography is unable meet the long-term demand because of the insurmountable technical barriers and prohibitive costs to further scale down the working wavelength in optical lithography, threatening the nanomanufacturing foundation for future technology growth.

Maskless lithography can write finer features by rastering a nanometer-size beam or probe to generate surface patterns, and has been applied to niche applications such as device prototyping and low-volume production. Among all maskless methods, the electron-beam lithography can provide high resolution beyond the 10-year industry roadmap. Electron-beam lithography also has the highest scanning speed, where a single electron beam is equivalent to the scanning-probe lithography employing $10^4$-$10^6$ parallel probes. A 5-6 orders of magnitude enhancement in electron-beam lithography throughput by using millions of high-brightness parallel electron beamlets will take over optical lithography and bring a paradigm shift in nanomanufacturing because of its low tool and process cost, short cycle time, and supreme flexibility.

Current researchers have focused on developing massively-parallel electron-beam lithography and achieved 2-3 orders of magnitude throughput enhancement using variety of methods, but the roadblock has been the lack of an enabling technology to generate millions of high-quality electron beamlets with satisfactory brightness and uniformity. Mapper lithography and reflective electron-beam lithography methods split one electron source into a total number of up to thirteen thousand and one million beamlets respectively. Their throughputs are limited by the total usable beam current, because the Pauli Exclusion Principle places a fundamental limit on the maximum brightness of an electron source. For producing 45-nm features, this source-splitting method has a 10-100 times lower throughput than that of optical lithography. For producing finer features, this method will yield even lower throughputs and become impractical for sub-10 nm features. Others have attempted to develop tip-based field emitter arrays which can break the limit of total useable beam current. However, field emission current changes rapidly with tip sharpness and extraction gap, which leads to tremendous technical barriers to make the emitter array with high yield and to address and control millions of tips in parallel. There are still no practical processes to scale up field emitters into large, high-yield arrays to generate high-quality electron beamlets. These barriers have blocked major efforts to develop field emission display and IBM's "Millipede". Therefore, improvements are needed in the field.

SUMMARY

The present disclosure provides a surface-plasmon-enhanced-photoemission (SPEP) lithography system. The disclosed SPEP lithography system progressively converts dynamic photon beamlets into localized electron beamlets through the couplings of surface photon and electron waves, so-called surface plasmons (SPPs), using an array of plasmonic lenses (PL). Unlike tip-based field emitters, the disclosed SPEP system has standard thin-film structures and strong tolerance for variations of their local geometry. The SPEP devices can be fabricated into a massive array with excellent uniformity using current facilities.

According to one aspect, a system for generating an electron beam array is provided, comprising a light source, a first substrate having a plurality of plasmonic lenses mounted thereon, the plasmonic lenses configured to received light from the light source and produce an electron emission, and a plurality of electrostatic microlenses configured to focus the electron emissions into a beam for focusing on a wafer substrate. The system may further comprise a light source modulator and a digital micro mirror which captures light from the light source and projects light beamlets on the plasmonic lenses.

BRIEF DESCRIPTION OF THE DRAWINGS

In the following description and drawings, identical reference numerals have been used, where possible, to designate identical features that are common to the drawings.

FIG. 4a is a diagram of a plasmonic lens according to one embodiment.

FIG. 4b is a k-space view of operation of the plasmonic lens of FIG. 4a.

FIG. 4c is a scanning electron microscope (SEM) picture of an array of plasmonic lenses according to one embodiment.

Figure 1:
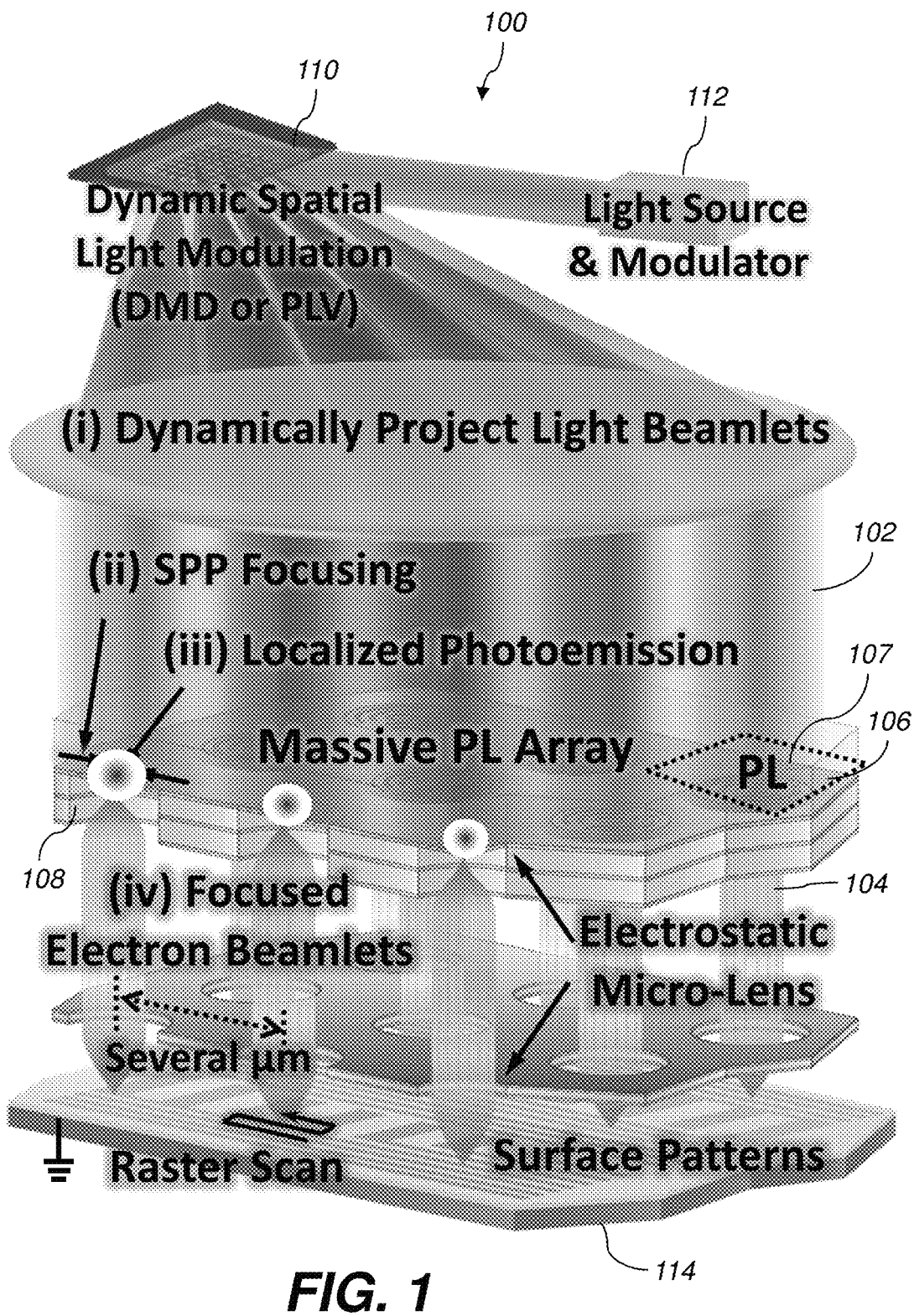
FIG. 1 is a diagram of a surface-plasmon enhanced-photoemission maskless lithography system according to one embodiment.

The attached drawings are for purposes of illustration and are not necessarily to scale.

DETAILED DESCRIPTION

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

FIG. 1 shows a SPEP lithography system 100 which progressively converts dynamic photon beamlets 102 into localized electron beamlets 104 through the couplings of surface photon and electron waves, so-called surface plasmons (SPPs), using plasmonic lenses 106. Unlike tip-based field emitters, the disclosed SPEP elements have standard thin-film structures and strong tolerance for variations of their local geometry. The SPEP elements can be fabricated into a massive array with excellent uniformity using current facilities.

According to one embodiment, the system 100 comprises an array 107 of plasmonic lenses 106 and electrostatic micro-lens pairs 108 packed as closely as 3 μm apart using a substrate as shown. The plasmonic lenses 106 may be formed in a metallic layer, such as gold or silver. During lithography, a dynamic spatial light modulator 110 (such as digital-micromirror-device (DMD) or Planar Light Valve (PLV)) and an ultrafast optical modulator 112 are used to project light beamlets 102 onto individual plasmonic lenses 106 as shown to control the switching and brightness of beamlets 102 and 104 at an effective rate of 10s of Tera-pixels/second, without the need for complicated addressable circuits and electron-beamlet-blanking array. The incident photons are first coupled into propagating-type SPPs by self-contained gratings of the plasmonic lenses 106 and guided towards the center of the plasmonic lenses 106, where the plasmons are further converted into highly localized plasmons and squeezed into a predefined photoemission site on the order of nanometers. At this site, photons, electrons and plasmons strongly interact, and the electrons are locally excited to near their vacuum levels. Meanwhile, the electrostatic micro-lens 108 will extract the excited electrons to form the accelerated beamlet 104, which later may be finely focused and rastered across a wafer 114 to write resist patterns. This massively parallel scheme allows high-resolution lithography using lower-energy electrons at several kilo-electronvolts. This step also greatly increases sensitivity of the resist material and avoids high-energy electrons damaging the underlying materials and structures.

Integrating the techniques of plasmonic lenses and photoemission as shown in FIG. 1 gives great advantages in lithography. Comparing with other electron sources, the photoemission source features its high brightness and small thermal spread which are essential for achieving fine resolution and high throughput in lithography. The photoemission quantum efficiency can reliably reach 0.1 to 1% for metallic materials and 10% after applying low-work function overcoats. Many photocathodes have been developed for the applications in imaging, lithography, detection, and energy. Photo-excited electron emitters have been demonstrated with an array size up to $10^5$, but the achieved beam currents are still low mainly because only small fraction of photons (about $10^{-5}$) can reach the photoemission site with a diameter on the order of nanometers. The presently disclosed SPEP approach can overcome this optical coupling deficiency by employing SPPs. SPPs have many scientific and engineering applications in computing, data storage, communication, nanoelectronic, nanophotonic and nano-biomedical engineering. SPPs can greatly enhance the photoemission by orders of magnitudes because of their preferably concentrated photon density and electrical field near the metallic surface. By taking advantage of SPPs' short wavelength and long decay lengths, plasmonic structures of a few μm size can efficiently squeeze photons at sub-10 nm scale with an optical efficiency as high as 70%. Among plasmonic nanofocusing structures, the plasmonic lenses developed feature their standard thin-film structures for easy fabrication and integration and can have a 10% or higher optical energy efficiency, therefore become the perfect candidates to generate massive number of highly localized and bright photoemission sources. As used herein, the term "plasmonic lens" (PL) shall be interpreted to mean any patterned structure that can concentrate incident optical energy using surface plasmon polaritons or bulk plasmons. A light of several watts will produce about 1 mA current from 1M beamlets, providing enough electron dosage to write 12" wafers at 100s wafer/hour, allowing sufficient redundancy to design a robust process. Our preliminary studies show that the presently disclosed SPEP device can produce features in the 10-50 nm range and the achievable features can reach sub-10 nm through further design optimization. Furthermore, the massive parallel scheme of system 100 allows individual electron beamlets to operate at low currents while maintaining a high total current. This will avoid the intra- and inter-beam Coulomb interaction and enhance the lithography resolutions.

Figure 2A:
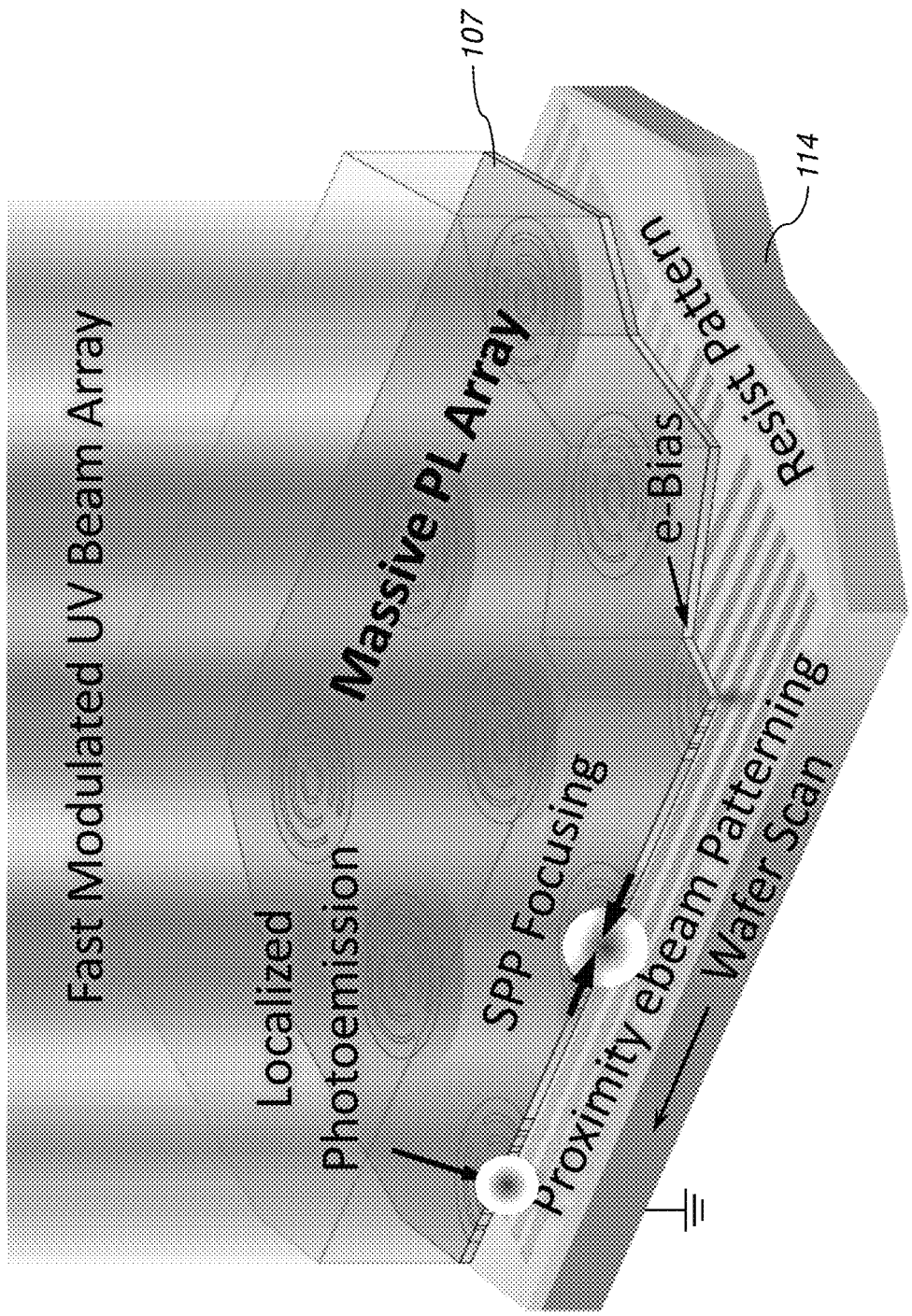
FIG. 2a is a diagram of a nanoscale directly-transmitted near-field mode SPEP system according to another embodiment.

FIG. 2a illustrates operation of the system 100 in a directly-transmitted near-field mode wherein the working gap between the plasmonic lenses 106 and the wafer 114 is on the order or nanometers (e.g., less than 500 nm, less than 100 nm, or less than 50 nm), and therefore the electrostatic micro-lenses 108 are not required. A bias voltage is applied across the gap between the array 107 and the wafer 114 resist layer. This allows the for 1) the generated beamlets to directly enter the resist layer to form patterns without the need of electron optics, and 2) the SPEP array to operate at a high beamlet current without being affected by the spread of initial photoelectron energies.

Figure 2B:
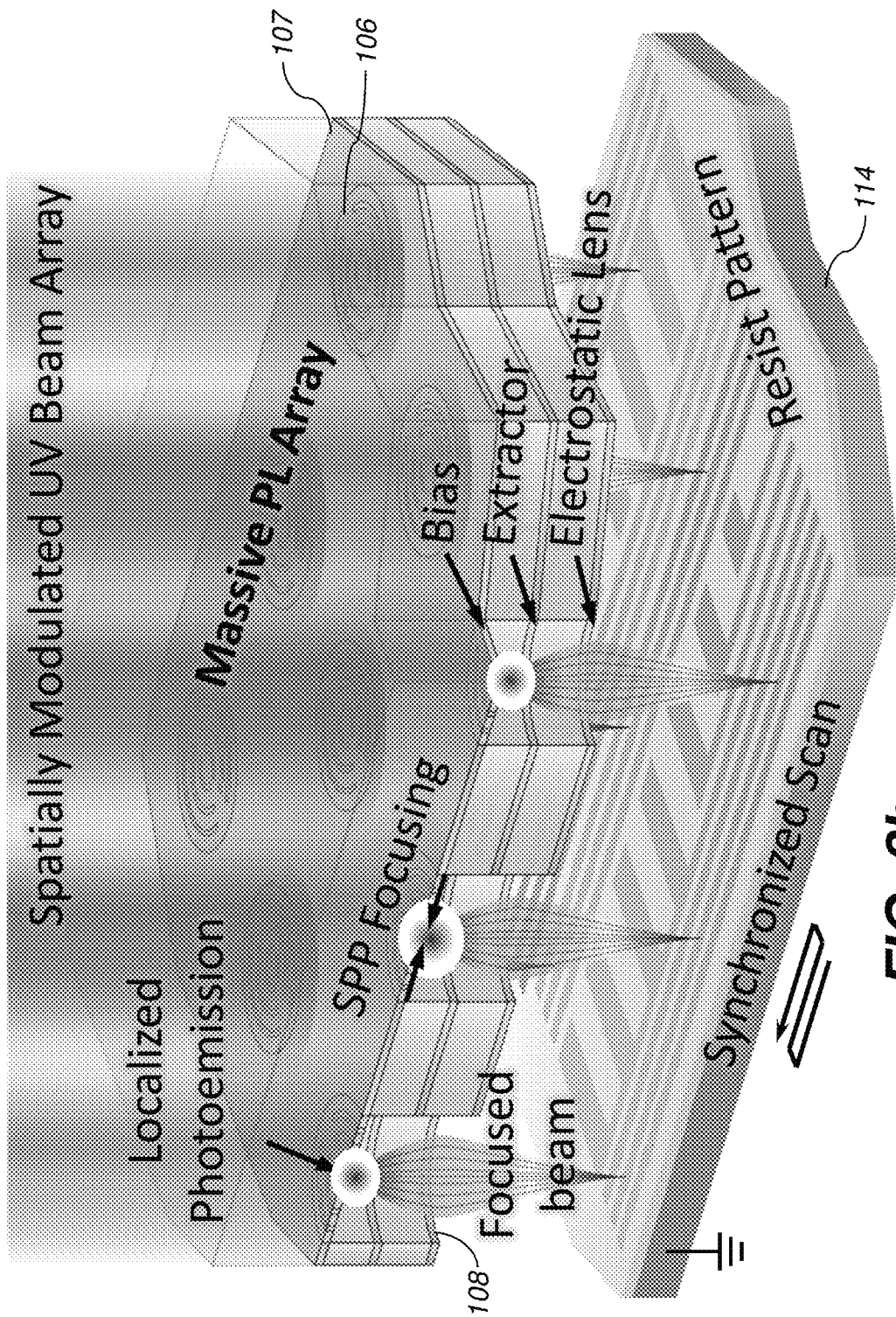
FIG. 2b is a diagram of a microscale electrostatic-optics-guided far-field mode SPEP system according to one embodiment.

FIG. 2b illustrates operation of the system 100 in a far-field electrostatic-optics-guided mode wherein the working gap between the array 107 and the wafer 114 is on the order of micrometers (e.g., between 1 and 100 m), wherein the electrostatic lenses 108 are included. The far-field mode allows 1) patterning on non-planar surfaces, and 2) producing features far smaller than the original size of the photoemission site by using demagnification capability of the electron optics.

Figures 3A, 3B:
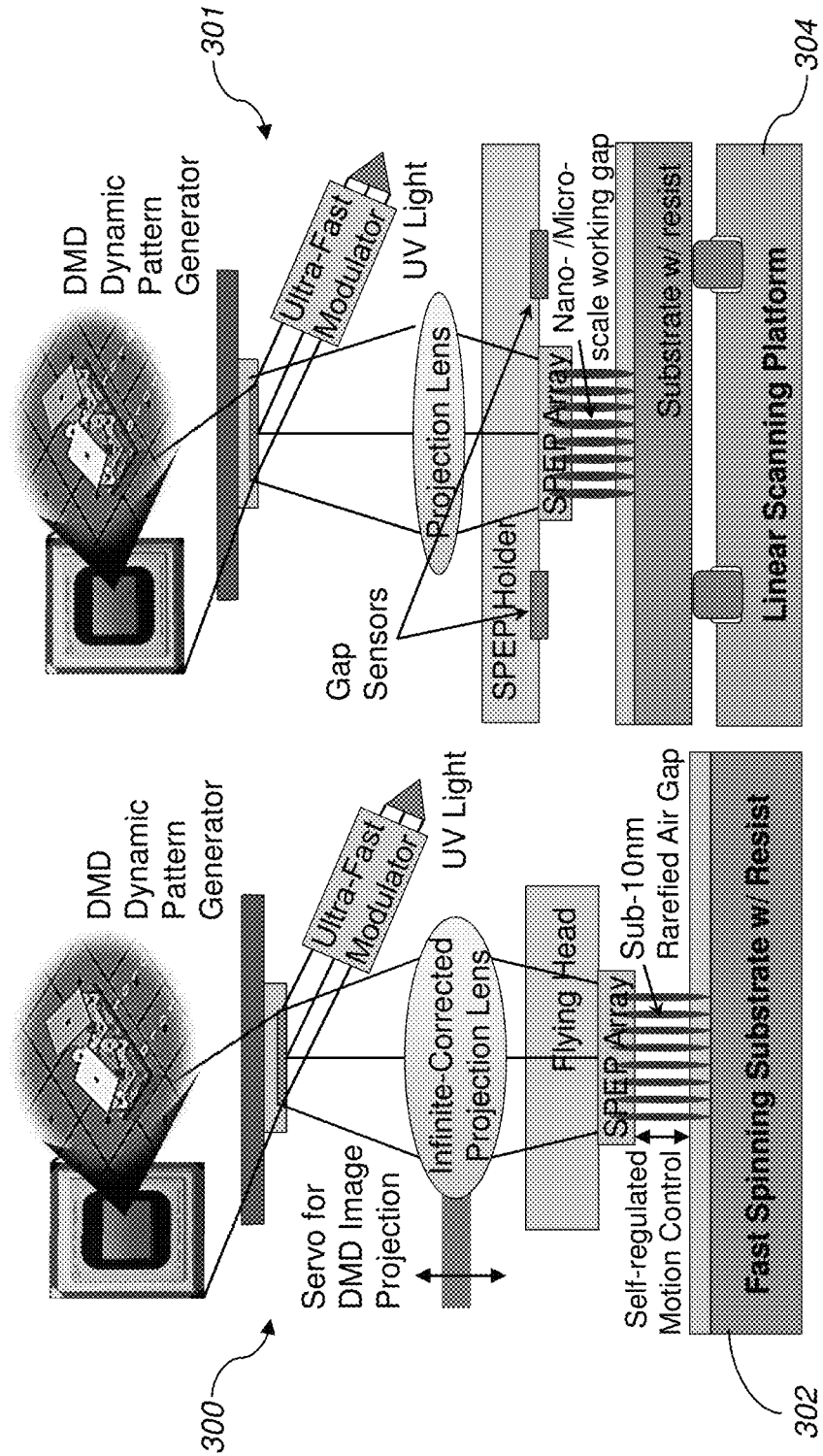
FIG. 3a is a diagram of a SPEP system having a spinning-type positioning platform according to one embodiment.
FIG. 3b is a diagram of a SPEP system having a linear translation positioning platform according to one embodiment.

The system 100, either in the embodiment of FIG. 2a or 2b, may be operated using raster scanning methods as shown in FIG. 3a (circularly spinning positioning using spinning platform 202) and FIG. 3b (linear translation positioning using linear scanning platform 204). Both methods are compatible with existing platforms for scalable nanomanufacturing, which are equipped with nanometrology and nanopositioning, and high-rate pattern generation capabilities.

The SPEP array 107 will produce focused electron beamlets to pattern at 10-50 nm size range. During lithography, according to one embodiment, a DMD is used along with an ultrafast electro-optic modulator to project light onto individual SPEP devices in the SPEP array 107 to control the switching and brightness of beamlets at an effective rate of 10s of Tera-pixel/sec without the need for a complicated beamlet-blanking array and addressable circuits.

In the embodiment of FIG. 3a, a plasmonic optical nanolithography system 300 comprises a spinning-type platform 302 on which the wafer 114 (substrate) is mounted and is hosted inside a clean-air environment. In this platform, the resist-coated wafer 114 (substrate) is continuously spun by a precision spindle to achieve a linear scanning speed of 1-20 m/s, and the relative motion between the wafer 114 (substrate) and the SPEP array 107 is controlled by a nanopositioning stage along the radial direction. This platform is capable of achieving a highly rarefied air gap of 2-20 nm between SPEP device and resist with a variation controlled at ±1 nm. This nanoscale gap is self-regulated using an airbearing surface (ABS) with a lateral positioning accuracy (1σ) at 2-3 nm, which is also employed in many hard-disk drives (HDDs). One example of an example ABS is a few millimeters in size and each ABS can carry up to 16,000 near-field SPEP devices. A real-time servo controller may be implemented in this platform in order to dynamically compensate the vertical resist substrate runout. In this spinning-type platform 202, lithography may be implemented using 3×3 beamlets, which corresponds to a throughput of 100 s of mm²/min (a total of 16,000 beamlet can process more than 100 12-inch wafers per hour at 10 nm resolutions).

In the embodiment of FIG. 3b, a plasmonic optical nanolithography system 301 comprises a linear scanning platform 302, which provides raster scanning using linear translation between the array 107 and the wafer 114 (substrate). The raster scanning motion of the resist-coated wafer 114 is controlled by a nanopositioning system which is capable of achieving a 3D positioning accuracy of sub-1 nm. The working gap between the array 107 and resist of wafer 114 is also monitored by an interferometric-spatial-phase imaging (ISPI) technique and controlled at real time with an accuracy of sub-1 nm. In this translation-type platform 301, lithography may be implemented using 32×32 beamlets at a throughput of 1 mm²/min. The practical throughput can reach 100s of wafers per hour in mass production if we 1) increase the total number of beamlets, 2) increase the mechanical stage scanning speed, and 3) add the electromagnetic components to perform fast electron beam deflection.

Figure 4B:
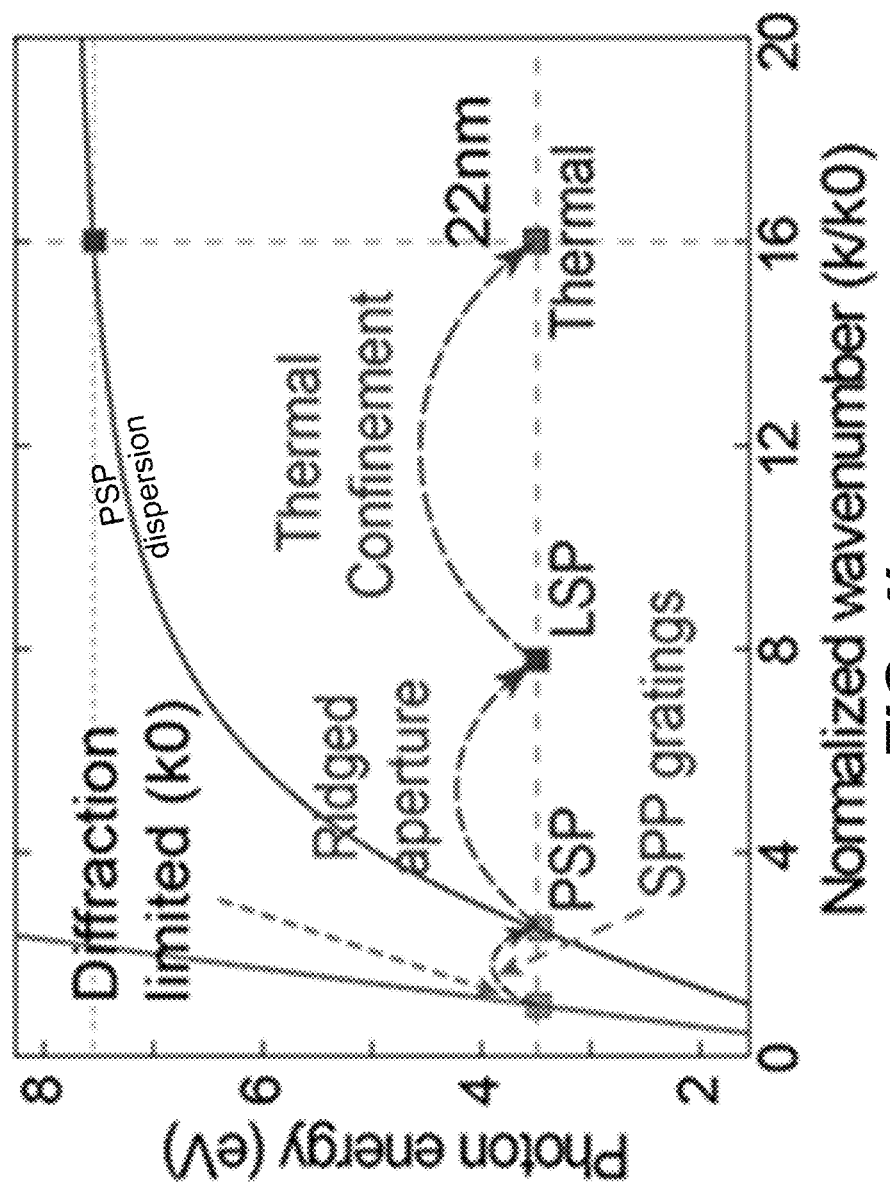

FIG. 4a shows an example of plasmonic lenses 106 according to one embodiment, which comprises a series of circular gratings 402 to excite the propagating SPP (PSP), an outermost ring reflector 404 to eliminate the crosstalk between neighboring plasmonic lenses, and the centered nanostructure 406 to further confine PSP into localized SPP (LSP). As shown in FIG. 4b, because of its nature of dispersion, the PSP has a wavenumber much larger than that of light in vacuum at the same excitation frequency which allows access to the sub-diffraction-limited objects. By further converting PSPs into LSPs, the system 100 can access diffraction-unlimited objects with a diameter on the order of nanometers, and the optical intensity of central focal spot is a few orders of magnitude of the incident light. FIG. 4c illustrates a scanning electron microscope (SEM) picture of an array of clase-packed plasmonic lenses 106 according to one embodiment.

Figure 4D:
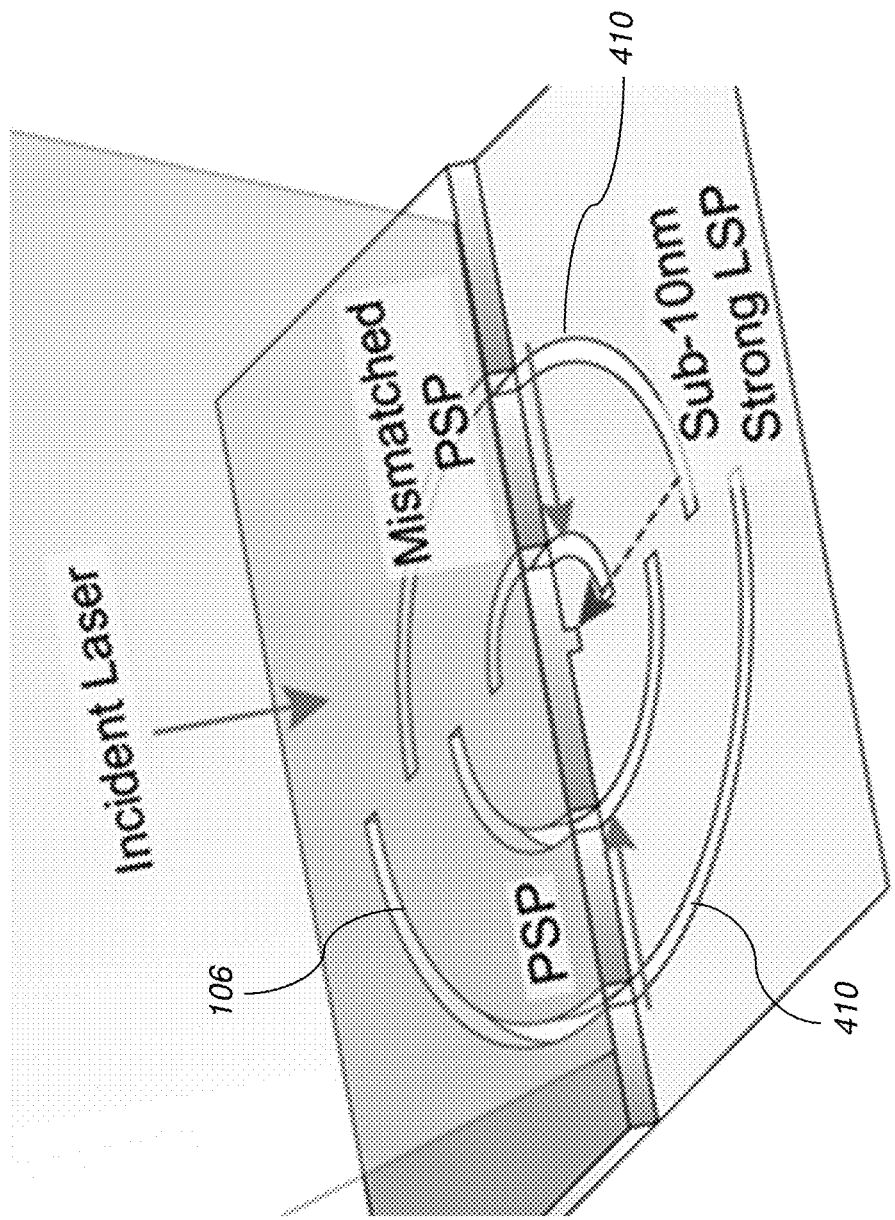
FIG. 4d is a diagram of a plasmonic lens having mismatched gratings according to one embodiment.
Figure 4E:
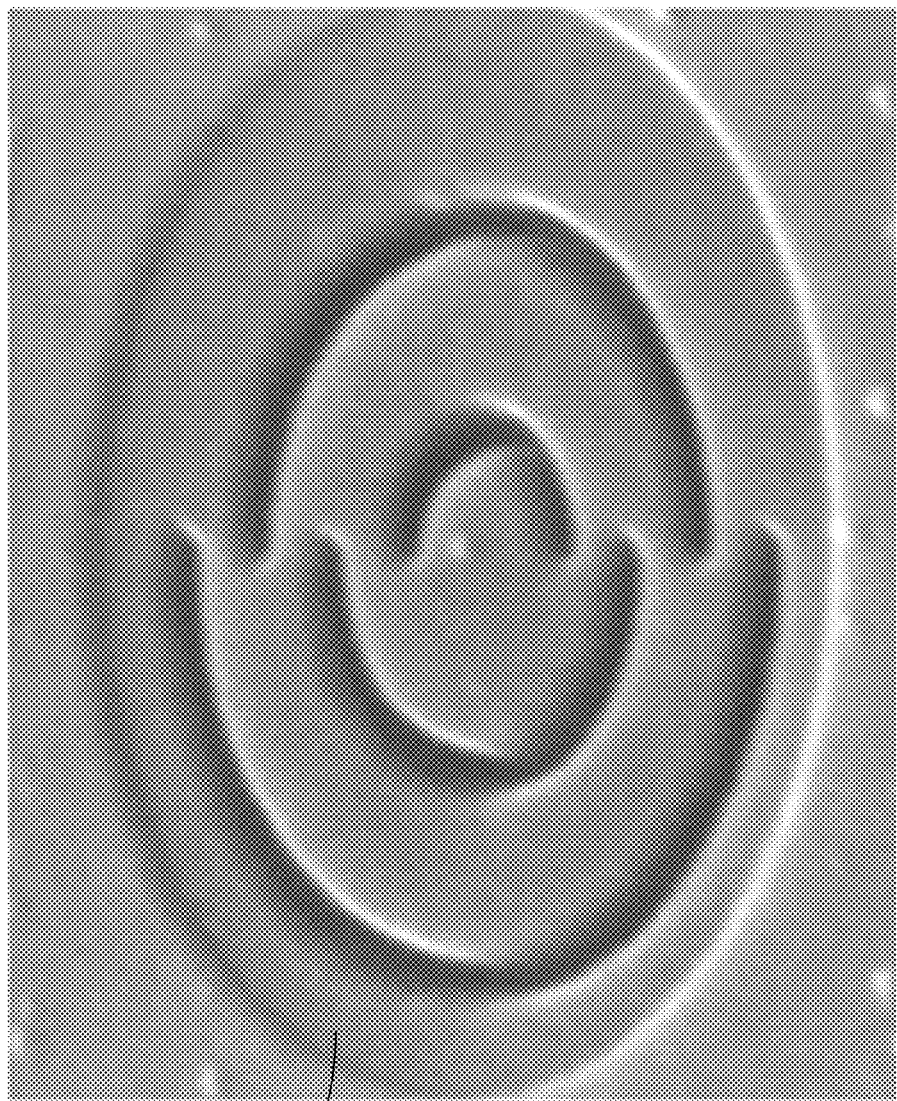
FIG. 4e is a SEM picture of the plasmonic lens of FIG. 4d.
Figure 4F:
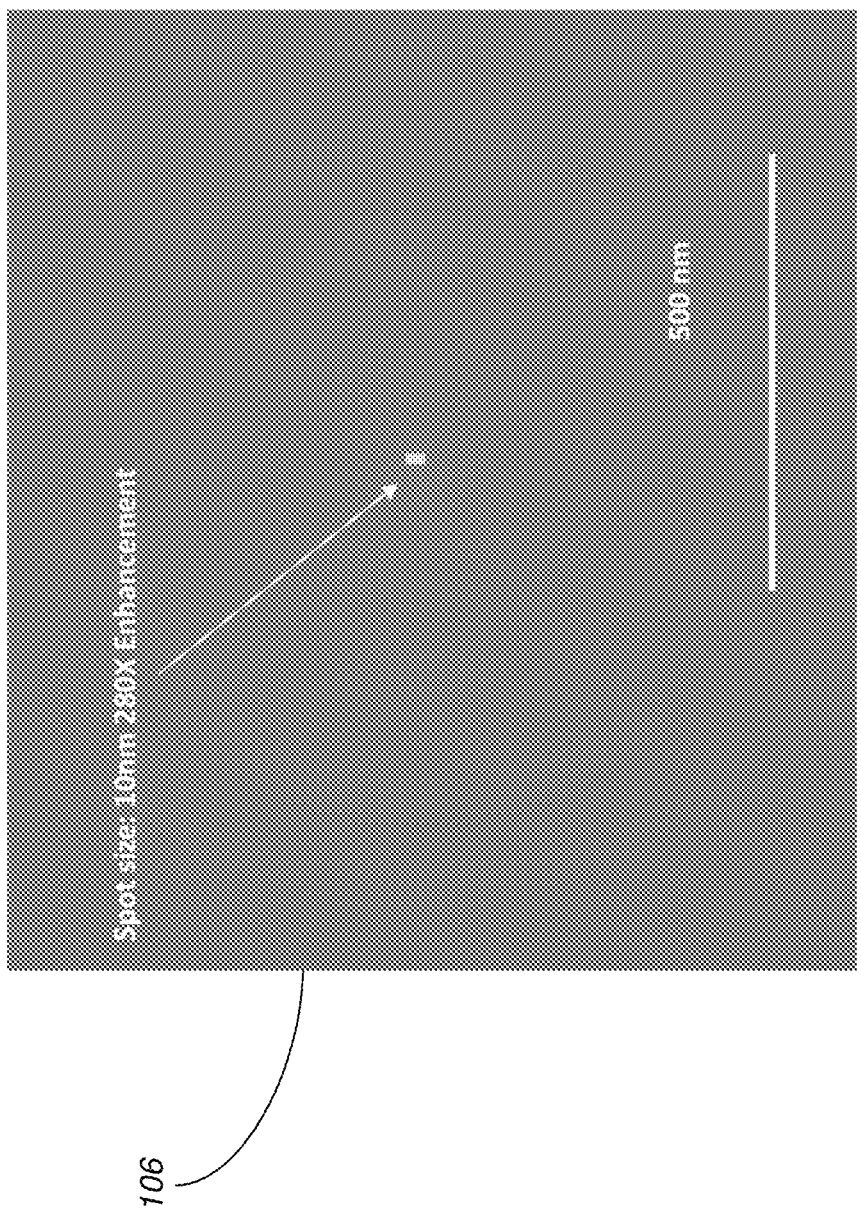
FIG. 4f shows simulation results based on use of the plasmonic lens of FIG. 4e.

FIG. 4d shows a further embodiment of a plasmonic lens 106, which improves the optical confinement to the extreme-sub-wavelength scale (~10 nm). An SEM picture of the device of FIG. 4d is shown in FIG. 4e. Here, two sets of mismatched SPP gratings 410 are employed to convert propagating SPP modes into localized particle modes and eventually to excite a 10-nm-diameter pin structure with 280 times enhancement with respect to the incident intensity. Comparing with other schemes that directly excite nanoscale tip or pole structures using lights, the PLs can provide orders of magnitude optical energy efficiencies reaching 10% or higher. FIG. 4f illustrates simulation results which show an enhancement of 280 times achieved with a spot of 10 nm.

When working with an external extraction electrical field and proper choices of materials, the highly localized and confined optical field from PLs can induce localized photoemission with low energy spread and high brightness, which are needed for obtaining both high throughput and fine resolution in electron-beam lithography processes.

Figure 5A:
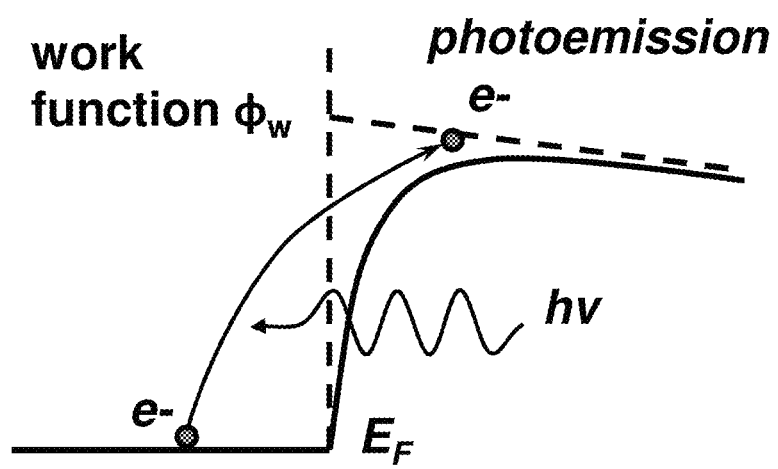
FIG. 5a is an illustration of an SPEP process and SPEP device simulations according to one embodiment.

The photoemission process can be considered in three successive stages in classic theory as shown in FIG. 5a, including photon absorption, electron transport, and electron escape. The localized optical field intensity determines the number of photons, and we can obtain the photon absorption rate based on the number of occupied and unoccupied states at the photoemission site. After photon absorption, some excited electrons will undergo ballistic transport and reach the metal-vacuum interface. Depending on their energy levels and material properties, those excited electrons with trajectories inside the escape cone will be able to transmit through the metal-vacuum interface and become photoelectrons.

The photoemission quantum efficiency QE (emitted electrons vs absorbed photons) near the threshold, can be calculated as Equation (1) with the emitted electron energy as Equation (2), $$QE = \frac{1}{2}\left(1 - \sqrt{\frac{E_F + \phi - \phi_{Schottky}}{E_0 + \hbar\omega}}\right) \quad (1)$$

$$\frac{\lambda_{e-e}}{d_{opt} + \lambda_{e-e}} \frac{(\hbar\omega + \phi_{Schottky} - \phi)^2}{8(\phi - \phi_{Schottky})(E_F + \phi - \phi_{Schottky})}$$

-continued $$E_{emission} = E_0 + \hbar\omega + \phi_{Schottky} - (E_F + \phi) \qquad (2)$$

where $E_0$ is the initial electron energy following the Fermi-Dirac distribution, $E_F$ is Fermi energy level, $\hbar\omega$ is the incident photon energy, $\phi_{Schottky}$ [eV]=$3.795\times10^{-5}$ $\sqrt{E[V/m]}$ is the peak value of the Schottky potential due to external electrostatic field. The $\lambda_{e-e}$ is the electron-electron scattering distance, and $d_{opt}$ is the optical field depth. Before considering the additional enhancement by the Schottky effect and localized surface plasmons, the QE can reliably reach 0.1 to 1% for metallic materials and 10% after applying low-work function overcoats. The example structures shown in FIG. 4d contains several features which are optimized for better SPEP performance, such as 1) centered photoemission pin has critical dimensions comparable with $\lambda_{e-e}$ which effectively reduces $d_{opt}$ to the be same value of $\lambda_{e-e}$, 2) working with low-energy emitted electrons to improve beam quality, and 3) Schottky effects and SPP's electric field provide further QE enhancement and fine tuning capabilities.

Figure 5B:
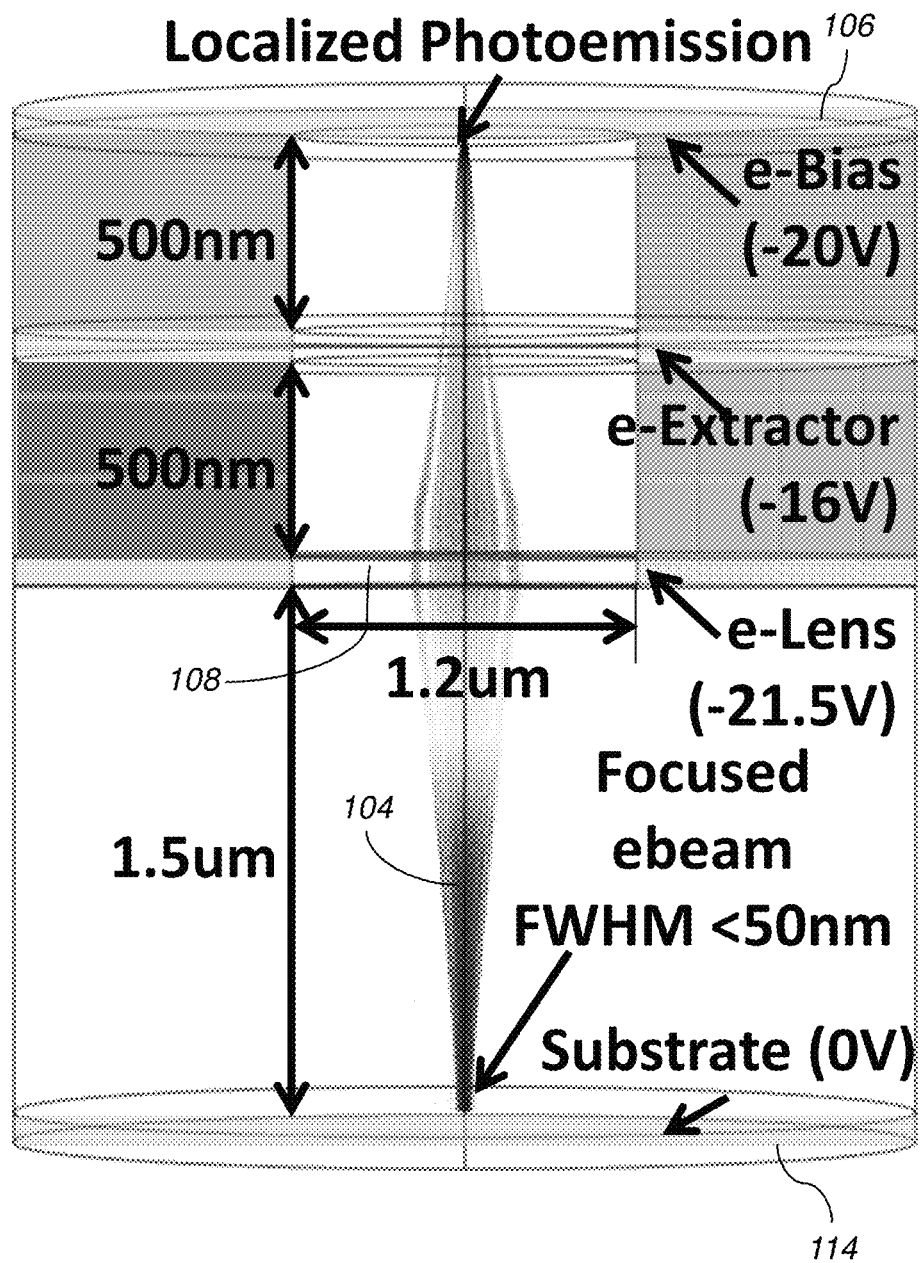
FIG. 5b is a diagram showing a far-field SPEP device according to one embodiment.

FIG. 5b shows an embodiment of the far-field SPEP array 107 (e.g., from system 301) according to the present disclosure with an overall size of 3 μm and a 1.5 μm working distance. In this example design, a beam of low energy electrons is generated from 20-nm size localized photoemission site activated by a PL, and a serial of electrostatic potentials are applied to guide and focus the photoelectrons to the resist surface. By adjusting the electrostatic lens design and operating voltages, the beam energy and working distance can easily vary in the range of 10-10,000 eV and 1-10,000 μm, respectively, achieving a 10-50 nm (FWHM) spot within a 100s nm focal depth, which will meet most of lithography requirement for massively parallel patterning. This far-field SPEP method allows patterning using lower-energy electrons at several keV, which greatly increases resist sensitivity and avoids high-energy electrons potentially damaging the underneath devices and substrate.

Figure 5C:
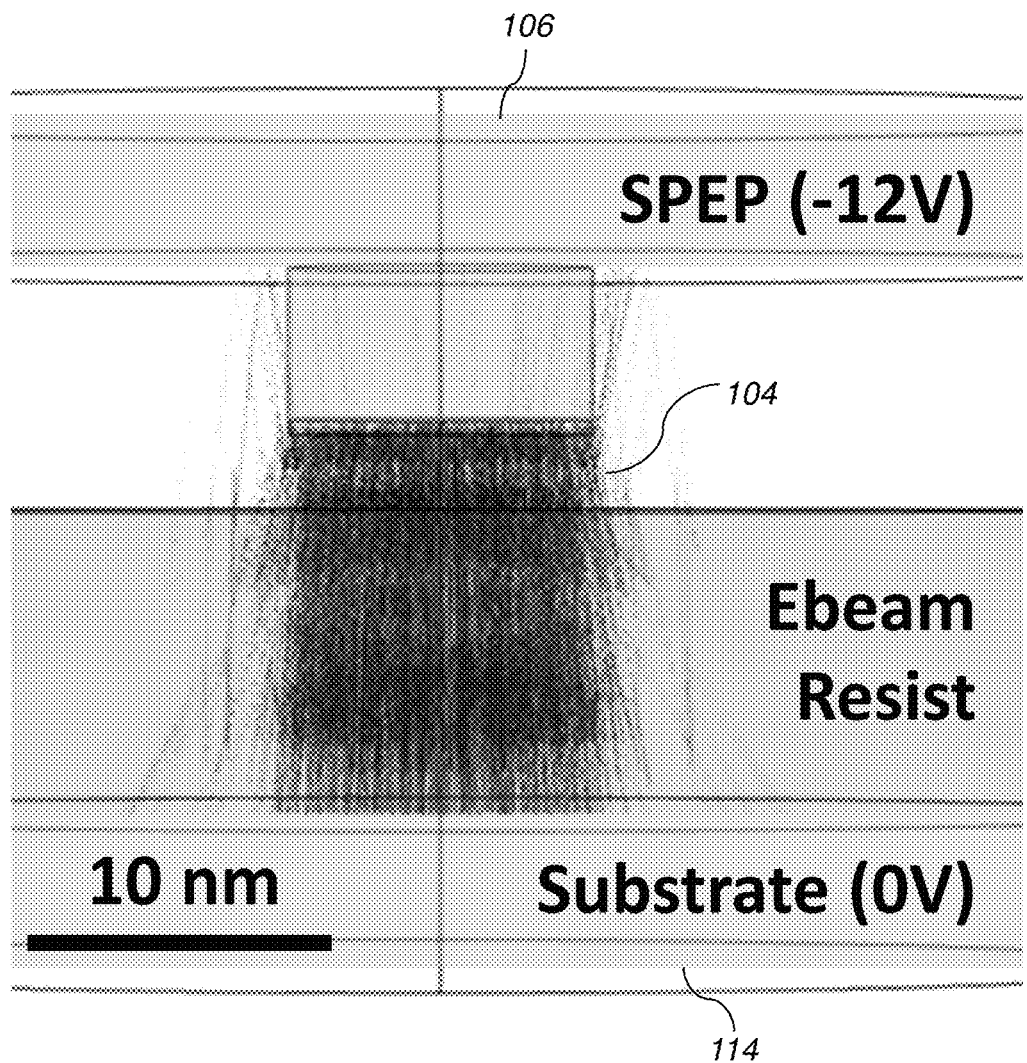
FIG. 5c is a diagram showing a near-field SPEP device according to one embodiment.

FIG. 5c shows the photoelectron trajectory simulation for the proximity type of near-field SPEP. In this design, a beamlet is generated from a localized photoemission site of 10 nm size and enter resist layer maintaining the same size. Electrostatic and charged particle trajectory simulators in COMSOL were used to perform electron beam trajectory simulations.

Figures 6A, 6B, 6C:
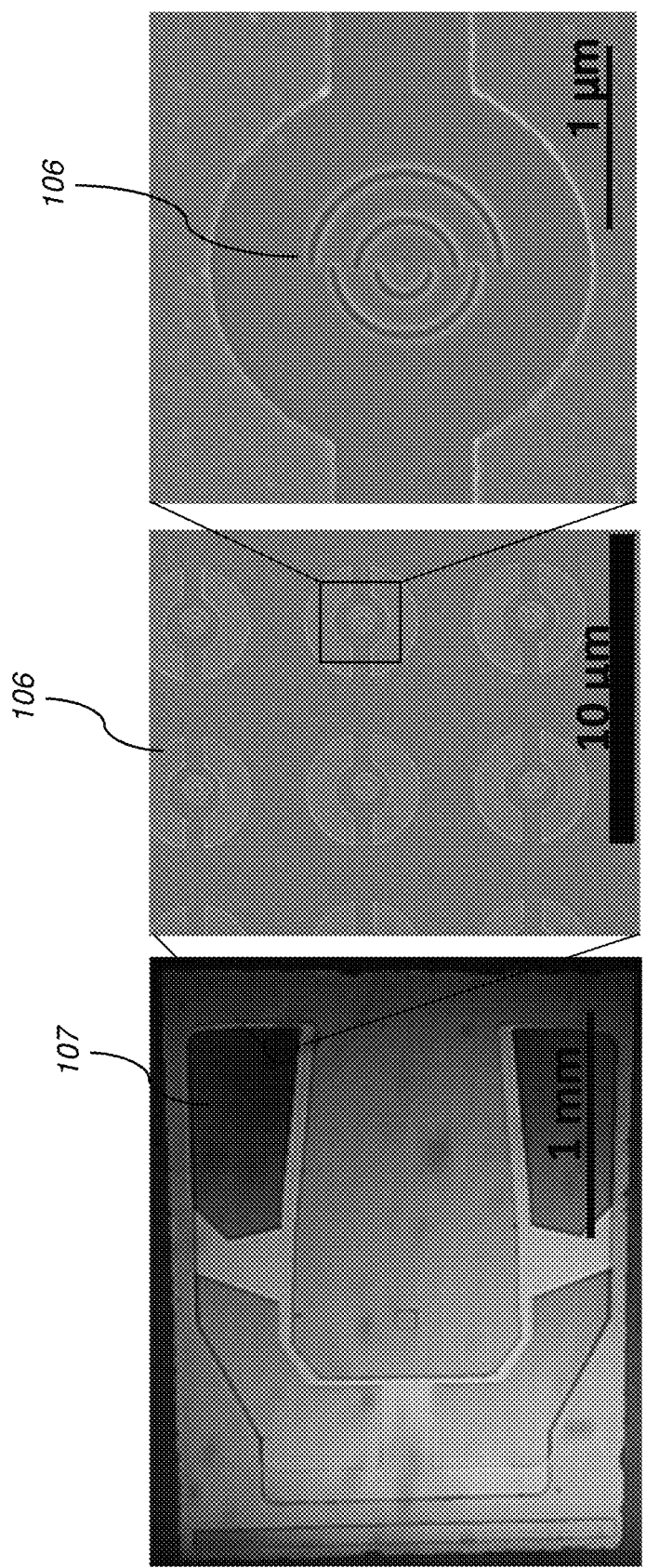
FIG. 6a is a photograph of an airbearing surface (ABS) taken under a white-light interferometer system according to one embodiment.
FIG. 6b is a SEM picture of a near-field SPEP array on the ABS of FIG. 8a according to one embodiment.
FIG. 6c is a SEM picture of a individual plasmonic lens device of the array of FIG. 8b according to one embodiment.

According to one embodiment, a near-field SPEP array fabrication process on an ABS is shown in FIG. 6. FIG. 6a shows a metal-coated ABS scanning at a linear speed of ~10 m/s over a transparent wafer covered by semi-transparent resist layer. The photo was directly taken using a white light interferometer which is built into a test spinning type platform and capable of monitoring of working gap at nanometer scale. The interference color at the circled location indicated a working gap of 10 nm between scanning head and resist surface, where a near-field SPEP array was fabricated (FIG. 6b-c).

According to one embodiment, the far-field SPEP array 107 may be fabricated as following: a) fabricate near-field SPEP array with photoemission sites, b) an overcoat is deposited to protect the emission interface from possible contaminations, c) deposit metallic and dielectric layers for electron extractor and electrostatic lenses 108, d) selective dry and wet etchings to define the hollow micro-columns, e) after securing the far-field SPEP array into a nanomanufacturing platform under controlled clean environments, use a laser to selectively remove the protective overcoats before starting the lithography process.

In one embodiment, the near-field SPEP can operate in clean air. Through aerodynamic design, an ABS can obtain a highly rarefied air gap underneath the near-field SPEP array with a pressure of ~100 Pa, which eliminates the scattering between electron and air molecules and the undesired avalanche gas electrical breakdown.

The far-field SPEP system 301 is compatible with the ultra-high vacuum (UHV) ($10^{-9}$-$10^{-7}$ Pa) operations. The SPEP array 107 can also produce excellent uniformity and high throughput patterns with less demanding requirements on operating environments. For example, at the pressure level of $10^{-2}$ Pa, the gas inside the micro-column is already highly rarefied (Knudsen number>$10^5$) and yields free molecular flow with concentration of far less than one molecule per column, which significantly reduces the chance of contamination and eliminates the avalanche gas electrical breakdown. Under this condition, monolayer formation time is longer than tens of milliseconds for surface adsorption. Meanwhile, the localized photoemission site has highly concentrated high energy photons (with a peak power of 1-100 GW/cm$^2$) to provide activation energy for surface desorption (~1 eV for $H_2O$ on clean gold surface) as well as keep a relatively higher local temperature than the critical values for most of common contaminations. By properly choosing the working wavelength (for $H_2O$, 255 nm light), we can trigger a self-cleaning mechanism to further keep the photoemission site clean. Metallic materials have shown reproducible and stable photoemission characteristics in contaminating environments (1.5-5 nA/mW produced at 257 nm illumination with ~0.2 eV spread from gold film).

According to one embodiment, an SPEP nanolithography process may be implemented using both translation-type and spinning-type nanomanufacturing platforms. In addition to performing standard procedures on the existing optical nanomanufacturing, electron beamlet brightness calibration may be performed for individual SPEP devices (e.g., system 100) to ensure the pattern uniformity. Afterwards, arbitrary patterns may be written into resist using nanopositioning system based on the relative position between the SPEP array and the resist surface, and followed by resist development and pattern transfer.

An important technique in the disclosed nanopositioning system 100 is the inline nanometer resolution metrology tool with dynamic feedback. In the presently disclosed translation-type systems 300 and 302, the separation between the array 107 and the wafer 114 (substrate) must be maintained with a gap at microscale for far-field SPEP and at nanoscale for near-field SPEP. The systems of the present disclosure utilize a metrology tool to provide a dynamic gap control with precision of a few nanometers (this system was developed for near-field optical lithography, which has a device-substrate separation less than 20 nm). Here we briefly describe this optical metrology tool, called interferometric-spatial-phase imaging (ISPI). This gap sensing method detects interference between a diffracted beam from patterns (e.g., chirped gratings) on the substrate and the incident beam, and therefore depends on separation of diffracted beams over a gap of greater than 2 μm. According to one embodiment, ISPI is extended to measure gaps smaller than 2 μm by using a novel method consisting of a grating embodying two discrete periods, illuminated by a multi-wavelength laser system. In operation, the spatial phase is measured at several known laser wavelengths, and the absolute gap is ascertained by fitting this data to an exact model of the spatial phase variations. Detectivity of sub-1 nm has been obtained, and a signal is expected at all gaps down to mask-substrate contact. Using feedback controls, the separation distance between the mask relative to the substrate can be maintained within 6 nm, therefore, the noises associated with the piezoelectric stage and the initial minor-misalignment (unparalleled) between the mask and substrate can be sufficiently compensated.

Steps of various methods described herein can be performed in any order except when otherwise specified, or when data from an earlier step is used in a later step. Exemplary method(s) described herein are not limited to being carried out by components particularly identified in discussions of those methods.

The invention is inclusive of combinations of the aspects described herein. References to "a particular aspect" (or "embodiment" or "version") and the like refer to features that are present in at least one aspect of the invention. Separate references to "an aspect" (or "embodiment") or "particular aspects" or the like do not necessarily refer to the same aspect or aspects; however, such aspects are not mutually exclusive, unless otherwise explicitly noted. The use of singular or plural in referring to "method" or "methods" and the like is not limiting. The word "or" is used in this disclosure in a non-exclusive sense, unless otherwise explicitly noted.

The invention has been described in detail with particular reference to certain preferred aspects thereof, but it will be understood that variations, combinations, and modifications can be effected within the spirit and scope of the invention.

The invention claimed is:

1. A system comprising:
   a light source configured to provide a plurality of light beams;
   a first substrate having a plurality of plasmonic lenses mounted thereon, the plasmonic lenses configured to produce a plurality of corresponding electron emissions onto a wafer substrate, wherein the plasmonic lenses are configured to receive light beams from the light source, and wherein an entirety of each plasmonic lens of the plurality of plasmonic lenses comprise a metal layer.

2. The system of claim 1, further comprising a plurality of electrostatic microlenses configured to focus the electron emissions into corresponding electron beams for focusing on the wafer substrate.

3. The system of claim 1, further comprising a light source modulator connected to the light source.

4. The system of claim 1, further comprising a digital micro mirror which captures light from the light source and projects the light beamlets on the plasmonic lenses.

5. The system of claim 1, further comprising a positioning platform, the positioning platform connected between the first substrate and the wafer substrate, the positioning device configured to move the wafer substrate in relation to the first substrate.

6. The system of claim 5, wherein the positioning platform is a spinning positioning system.

7. The system of claim 5, wherein the positioning platform is a linear translation positioning system.

8. The system of claim 2, wherein the plurality of electrostatic microlenses are positioned between the plasmonic lenses and the wafer substrate.

9. The system of claim 5, wherein the wafer substrate is coated with a resist material, and wherein the positioning system is configured to create a pattern in the resist due to interaction between the electron emissions and the resist material.

10. The system of claim 5, wherein the positioning system is configured to maintain a gap of less than 100 nanometers between a bottom surface of the first substrate and a top surface of the wafer substrate.

11. The system of claim 10, wherein the positioning system is configured to maintain a gap of less than 50 nanometers between a bottom surface of the first substrate and a top surface of the wafer substrate.

12. The system of claim 8, wherein the positioning system is configured to maintain a gap of between 1 micrometer and 10 micrometers between a bottom surface of the first substrate and a top surface of the wafer substrate.

13. The system of claim 1, wherein the plasmonic lenses comprise an outer ring reflector surrounding a center nanostructure.

14. The system of claim 1, wherein the plasmonic lenses comprise mismatch semicircular gratings.

15. The system of claim 1, wherein the plasmonic lenses are formed in an array on the first substrate.

16. The system of claim 1, wherein the distance between centers of the plasmonic lenses is between 1 and 20 micrometers.

17. The system of claim 1, wherein the metal layer comprises silver or gold.

18. The system of claim 1, wherein the light source modulator comprises digital-micromirror-device (DMD) or planar light valve (PLV).

19. A system comprising:
    a light source;
    a first substrate having a plurality of plasmonic lenses mounted thereon, the plasmonic lenses configured to produce a plurality of corresponding electron emissions onto a wafer substrate, wherein the plasmonic lenses are configured to receive light beams from the light source, and wherein each plasmonic lens of the plurality of plasmonic lenses comprise a metal layer.

20. A system comprising:
    a light source;
    a first substrate having a plurality of plasmonic lenses mounted thereon, the plasmonic lenses configured to produce a plurality of corresponding electron emissions onto a wafer substrate, wherein the plasmonic lenses are configured to receive light beams from the light source, and wherein an entirety of each plasmonic lens of the plurality of plasmonic lenses comprise a metal layer.

* * * * *